United States Patent [19]

Eskandari et al.

[11] Patent Number: 5,828,825

[45] Date of Patent: Oct. 27, 1998

[54] METHOD AND APPARATUS FOR PSEUDO-DIRECT ACCESS TO EMBEDDED MEMORIES OF A MICRO-CONTROLLER INTEGRATED CIRCUIT VIA THE IEEE TEST ACCESS PORT

[75] Inventors: Nick G. Eskandari, Chandler; David D. Sprague, Gilbert, both of Ariz.

[73] Assignee: Intel Corporation, Santa Clara, Calif.

[21] Appl. No.: 633,930

[22] Filed: Apr. 12, 1996

Related U.S. Application Data

[63] Continuation of Ser. No. 173,404, Dec. 22, 1993, abandoned.

[51] Int. Cl.$^6$ .............................. G06F 11/00; G06F 15/16
[52] U.S. Cl. .............................. 395/183.03; 395/183.22; 395/200.09
[58] Field of Search .................... 395/183.03, 183.06, 395/183.16, 183.18, 183.19, 183.2, 183.22, 427, 200.09

[56] References Cited

U.S. PATENT DOCUMENTS

| 4,755,937 | 7/1988 | Glies ........................................ 711/149 |
| 5,253,347 | 10/1993 | Bagnoli et al. .......................... 395/293 |

OTHER PUBLICATIONS

"IEEE Standard Test Access Port And Boundary–Scan Architecture", IEEE Std 1149.1–1990, May 21, 1990.

*Primary Examiner*—Hoa T. Nguyen
*Attorney, Agent, or Firm*—Blakely, Sokoloff, Taylor & Zafman

[57] ABSTRACT

A method and apparatus are provided for testing memory locations of embedded memories or on-board caches of a micro-controller, a micro-processor or a CPU-based integrated circuit through use of a test access port (TAP) such as the IEEE TAP described in "IEEE Standard Test Access Port and Boundary-Scan Architecture" (IEEE Std. 1149.1–1990). The TAP is utilized to serially shift address, data and command information provided by an external host into respective fields of a memory access register (MEMACC) located within a memory interface unit (MIU) of the CPU-based IC. Responsive to the command information, the TAP requests access to the IC's memory bus via the MIU. Next, the address, data and command information for accessing the embedded memory are serially shifted into the MEMACC. If a read operation is specified by the command information, the MIU returns the data stored in the specified memory location of the embedded memory and replaces the data within the data field of the MEMACC with the newly retrieved data. If a write operation is specified by the command information, the MIU transmits the data held in the data field of the MEMACC to the memory location specified. Finally, the data, address and command information stored in the MEMACC are serially shifted out via the TAP to the external host which analyzes the data output therefrom.

11 Claims, 3 Drawing Sheets

METHOD AND APPARATUS FOR PSEUDO-DIRECT ACCESS TO EMBEDDED MEMORIES OF A MICRO-CONTROLLER INTEGRATED CIRCUIT VIA THE IEEE TEST ACCESS PORT

This is a continuation of application Ser. No. 08/173,404, filed Dec. 22, 1993, now abandoned.

BACKGROUND OF THE INVENTION (1). Field of the Invention

The present invention relates to the field of testing integrated circuits, and more particularly, the field of accessing embedded memory arrays or on-board caches of a micro-controller, a micro-processor or a CPU-based integrated circuit.

(2). Prior Art

In the manufacture of integrated circuits and the like, manufacturing process improvement for a particular product is crucial in order to obtain a product which is virtually defect free and produces a high yield in the manufacturing process. However, for products comprising integrated circuits which are based on a micro-controller, a micro-processor or a CPU design (hereinafter referred to as a "CPU-based IC") and have embedded memory or on-board caches (hereinafter referred to as "embedded memory"), process improvement becomes a very onerous task when a manufacturing defect causes operation of the CPU to fail. This is because of the difficulty posed in locating the placement of the defect in the CPU-based IC. For example, when a manufacturing defect occurs in an IC, the defect essentially appears at a random location so as to potentially cause failure of the IC or an interconnection between circuits of the IC, which in turn, may result in a functional failure of the CPU. In this case, a process developer must debug the functional failure by determining the cause of the failure in order to ascertain the specific location of the defect, or at least, the type of defect that occurred.

In the past, two conventional methods have been commonly used to debug a CPU functional failure for manufacturing process improvement of a CPU-based IC. One method is to use a process development product such as a SRAM or EPROM memory array. This method allows easy debugging of the process since there is typically a direct correlation between the physical defect location on the silicon die and the failure signature of the die found during testing. The major problem posed with this method is that the defects which cause the CPU failure in the development products are not always the same as the defects found to cause failures in the commercial products. In addition, the cost of the final product may be very high since typically none of the development products are sold in the market place, thereby preventing recoupment of the investment made on the material used for the process improvement.

An alternate method is to use the commercial product itself to debug the manufacturing defect. This method can usually be done relatively easily if the IC has embedded memory on the product and the CPU has not failed. However, the problem arises where the CPU has failed and there is no method for accessing the embedded memory. When this happens, the debugging effort requires a large expenditure of time and effort in addition to extensive product knowledge, expertise and sophisticated tools to run a plurality of test batches and decipher the logical states of the failed CPU. This is even more of a problem when one considers that the probability of a CPU failure occurring due to a manufacturing defect is very high because of the large amount of circuit area required by the CPU which provides more of chance for a fatal defect to occur.

With respect to conventional methods for the testing of printed circuit boards, debugging has been conducted through the use of a "bed of nails" approach in which a printed circuit board having a defective IC was placed on a receiving test board adapted with protruding pins (i.e., "nails") making contact with the pins of all the IC's. In this manner, the physical interconnections of the IC's in addition to the operation of the individual functional modules of each IC could be tested to determine the location of the defect and the cause of the CPU failure. However, in the era of VLSI and ULSI IC's, surface mount technology has evolved to such a degree that it is practically impossible to make reliable contacts to miniaturized features of the printed circuit board, thereby inhibiting use of the bed of nails approach. Furthermore, printed circuit boards are now designed to receive IC's on both sides of the board so that the contacts of the receiving test board cannot now be connected to the pins of the IC's.

In consideration of these problems, the Test Technology Technical Committee of the IEEE Computer Society developed a mechanism for accessing the internal workings of an IC in order to 1) test the interconnections between integrated circuits once they have been assembled onto a printed circuit board, 2) test the IC itself and 3) observe or modify the activity of the IC during its normal operation. This mechanism is known as the "Test Access Port and Test Logic Architecture"(Hereinafter referred to solely as "TAP") and is described in the document entitled IEEE Standard Test Access Port and Boundary-Scan Architecture (IEEE Std. 1149.1–1990), this document being incorporated herein by reference. The objective of the Standard is to provide a means for accessing and a means for controlling design-for-test features which are built directly into the IC's themselves. This is accomplished by providing circuitry that enables test instructions and associated test data to be serially fed into the IC, and further enables the results of the execution of such instructions to be serially read out. The test logic defined by the Standard is designed such that the serial movement of instructions and data, controlled by an external TAP host, is not apparent to those circuit blocks whose operation is controlled by the instruction.

Nonetheless, as described in the Standard, the TAP is designed primarily for testing of the interconnections between IC's on a printed circuit board. In this regard, the Standard proposes the use of boundary-scan architecture wherein test data can be shifted into boundary-scan register cells associated with the output pins of the IC and loaded in parallel through the IC interconnections into those cells associated with the IC's input pins.

Therefore, in order to provide a relatively simple mechanism for determining the location of a manufacturing defect, it would be desirable to utilize the TAP architecture and logic for accessing of embedded memory arrays of an IC (whether it be implemented as package IC or implemented on a printed circuit board) when a functional failure of the on-board CPU has occurred. This is because the TAP architecture provides the ability to access the internal operations of the product without dependence upon the on-board CPU which may fail upon the occurrence of a defect. Additionally, the TAP architecture is well-suited for just such a task since it utilizes a minimum of internal interconnections in addition to a very small surface area of the IC such that the likelihood of a manufacturing defect occurring within the TAP architecture is very small. Because of these advantages, a significant amount of time as well as manufacturing resources can be saved in identifying and correcting manufacturing defects.

It is therefore an object of the present invention to provide a method and apparatus for testing memory locations (in addition to associated decoders and sense amps) of an embedded memory or on-board cache of a micro-controller, a microprocessor or a CPU integrated circuit through use of the IEEE TAP architecture and logic.

It is another object of the invention to provide a method and apparatus for a synchronously disabling the IC's on-board CPU as the bus master, acquiring control over the memory interface unit and performing read and write operations to memory via a memory bus in order to interrogate different memory locations.

It is yet another object of the present invention to provide a memory access (or "MEMACC") register for temporarily holding instruction, address and test data information in addition to performing read and write operations to and from memory and an external host which analyzes the information to determine whether a particular memory location is defective.

SUMMARY OF THE INVENTION

To accomplish these and other objectives, the present invention utilizes the IEEE TAP architecture and logic to serially shift address, data and command information into respective fields of a memory access (MEMACC) register located within the memory interface unit (MIU) of the CPU-based IC. This register acts as an interface between the TAP architecture and the embedded memories of the IC for reading and writing data to and from specified memory locations.

The TAP architecture includes, among other things, a TAP port, a TAP controller and an instruction register. The TAP port comprises a plurality of input and output pins for serially transmitting and receiving data and control information to and from the TAP controller and instruction register. The TAP controller contains a synchronous finite state machine that controls the sequence of operations of the TAP circuitry. The instruction register is used to select the test to be performed or the test data register to be accessed or both by serially shifting an instruction into the register and latching the instruction into the finite state machine at the completion of the shifting.

In utilizing the TAP architecture to perform accesses to embedded memory locations, the TAP controller is first instructed that a MEMACC operation is to be performed by serially shifting into the instruction register a MEMACC opcode via an input pin. The TAP controller reads the opcode and requests access to the memory bus via the MIU. The MIU disables the CPU as the bus master when the CPU is not performing a memory operation.

Next, the address, data and command bits for the memory access are serially shifted into the MEMACC register by placing the register between the input and output pins of the TAP port. A read or a write operation is then requested based upon the value of the bit in the command field of the MEMACC register. Subsequently, if a read operation was requested, the MIU returns the data stored in the memory location specified and replaces (in a parallel format by use of a capture function) the data within the data field of the MEMACC register with the newly retrieved data. If a write operation was requested, the MIU transmits the data held in the address field of the MEMACC register (in a parallel format by use of an update function) to the memory location specified. Finally, regardless of whether a read or write operation was requested, all the data, address and command information stored in the MEMACC register is serially shifted out via an output pin of the TAP port to an external host.

In order to test the embedded memories of the IC, the external host simulates preselected operations of the CPU-based IC using a behavioral model of the IC. During simulation, the host stores the data input to and output from the model in an event history file. The input data of the event history file is then used to execute the same operations in the IC, while the host monitors the data output from the IC and compares it with output data stored in the event history file.

BRIEF DESCRIPTION OF THE DRAWINGS

The objects, features and advantages of the present invention will become apparent from the following detailed description in which.

DETAILED DESCRIPTION OF THE INVENTION

A method and apparatus for testing an embedded memory or on-board cache of a micro-controller, a micro-processor or a CPU-based integrated circuit through use of the IEEE TAP architecture and logic is described. In the following description, numerous details such as specific steps in the testing procedure, specific architectural units, etc. are given in order to provide a thorough understanding of the present invention. It will be obvious, however, to one skilled in the art that not all the details given are required to practice the present invention. In other instances, well-known system components, test features, methods and the like are not set forth in detail in order to avoid unnecessarily obscuring the description of the present invention.

Figure 1:
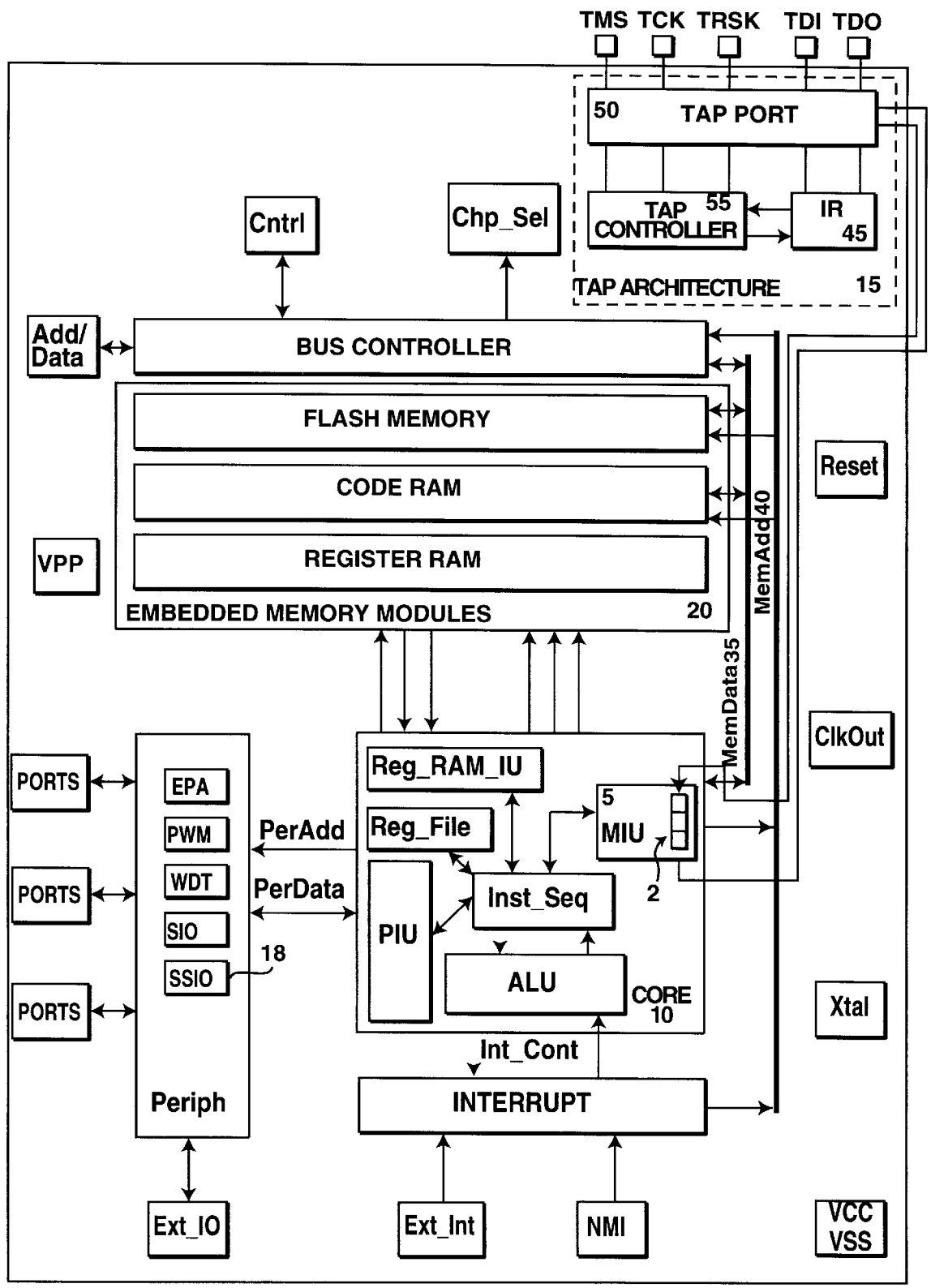
FIG. 1 is a block diagram of an Intel architecture micro-controller IC of the 80C296 product family showing a generalized implementation of the TAP architecture and its connections to the MEMACC register within the memory interface unit.

With respect to the preferred embodiment, the present invention is preferably implemented in a micro-controller integrated circuit having embedded memory, such as the 80C296 micro-controller manufactured by Intel Corporation, a block diagram of which is shown in FIG. 1. In this diagram, the TAP architecture 15 is shown as a functional block coupled to a memory interface unit (MIU) 5 of the 296 controller and having external connections via a TAP port 50. The MIU 5 controls accesses to the embedded memory modules which are outside of the 296 controller register file (Reg_file) by means of a memory bus (MemData and MemAdd) which allows the core 10 of the 296 controller to interface with the embedded memory modules 20 and the bus controller. In this implementation, the embedded memory modules 20 include a FLASH memory, a code RAM and a register RAM.

The TAP architecture 15 is also serially coupled to a plurality test data registers (not shown) of the 296 controller which include a 32 bit identification register, a 1 bit bypass register, a 144 bit boundary scan test register and an 8 bit test mode register, all of which are provided for related TAP functions. As is shown in FIG. 1, the TAP architecture 15 is further coupled to a 57 bit memory access (MEMACC) register 2 preferably disposed within the MIU 5 in order to provide an interface between the TAP architecture 15 and the embedded memories of the 296 controller for accessing and testing the memory locations thereof. However, as would be apparent to one skilled in the art, the MEMACC register 2 may alternately be placed external to the MIU 5 and still be able to accomplish its intended objectives.

Figure 2:
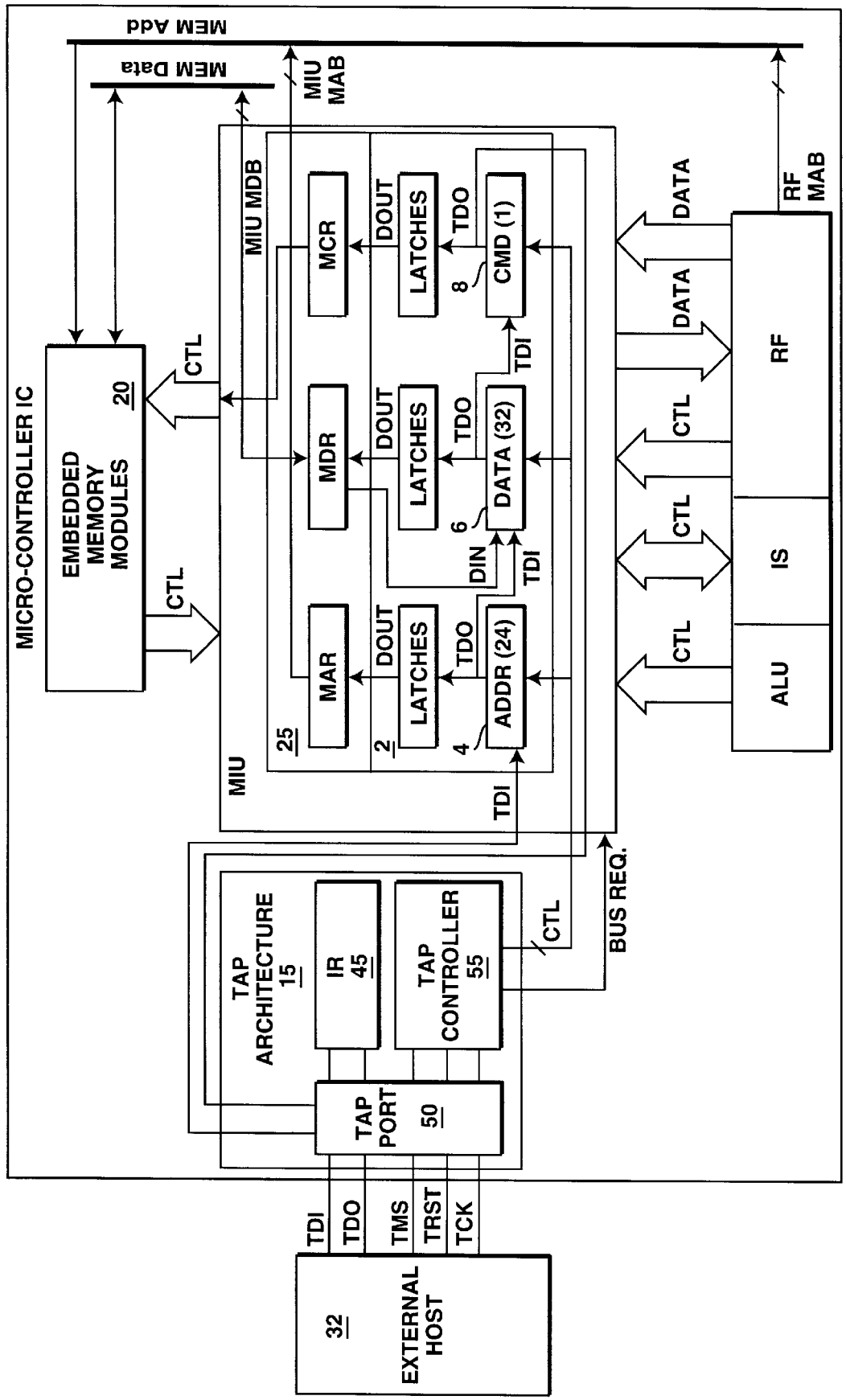
FIG. 2 is a more specific block diagram of the MEMACC register within the memory interface unit of the 296 micro-controller showing the address, data and command fields in addition to the associated latches of the register.

Referring to both FIGS. 1 and 2, the TAP architecture 15 comprises at least a TAP port 50, a TAP controller 53 and an instruction register IR 45. The TAP port 50 is the crucial interface between the TAP architecture 15 and an external host 32 which may comprise a micro-controller or micro-processor based system such as automatic test equipment (ATE) or a computer system. The TAP port 50 comprises a test clock input pin (TCK) for clocking the TAP controller 55 a synchronously with respect to the CPU's driving clock (not shown), a test mode select pin (TMS) for controlling the operation of the TAP controller 55, a test data in pin (TDI) for serially transmitting data and instruction signals in the TAP architecture (TAP circuitry), a test data out pin (TDO) for serially receiving data and instruction signals output from the internal TAP circuitry 15 and a test reset input pin (TRST) for providing asynchronous initialization of the TAP controller 15.

The TAP controller 55 contains a synchronous finite state machine that responds to changes of the TMS pin on rising edges of the TCK pin and controls the sequence of operations of the TAP circuitry 15. The TAP controller is coupled to the plurality of test data registers (not shown), the MEMACC register 2 and the instruction register IR 45 for controlling the timing and operation of the registers and the serial input and output to and from the TAP circuitry. The instruction register IR 45 is used to select the test to be performed or the test data register (not shown) to be accessed or both by serially shifting an instruction into the instruction register IR 45 and latching the instruction into the finite state machine at the completion of the shifting. In this implementation, the instruction register IR 45 forms a four bit shift register coupled to TDI, the MEMACC register 2 and TDO in addition to being connected in parallel to the TAP controller 15.

The following is a description of the different logical states to which the TAP controller 15 must be taken in order to load and execute an instruction and to access the test data registers (not shown) in terms of both read and write operations:

Test-Logic-Reset: In this state, the TAP circuitry 15 is disabled so that normal operation of the on-chip system logic (i.e., in response to stimuli received through the system pins only) can continue unhindered. Irregardless of the original state of the controller, it will enter Test-Logic-Reset when TMS is held high for at least five rising edges of TCK. The controller remains in this state while TMS is high. Upon leaving the Test-Logic-Reset controller state, the controller moves into the Run-Test/Idle controller state.

Run-Test/Idle: This is a controller state between scan operations. Once entered, the controller will remain in the Run-Test/Idle state as long as TMS is held low. When TMS is high and a rising edge is applied at TCK, the controller moves to the Select-DR-Scan state. In the Run-Test/Idle controller state, activity in selected test logic occurs only when certain instructions are present. For instructions that do not cause functions to execute in the Run-Test/Idle controller state, all test data registers selected by the current instruction retain their previous state (i.e., Idle).

Select-DR-Scan: This is a temporary controller state in which all test data registers selected by the current instruction retain their previous state. If TMS is held low and a rising edge is applied to TCK when the controller is in this state, then the controller moves into the Capture-DR state and a scan sequence for the selected test data register is initiated. If TMS is held high and a rising edge is applied to TCK, the controller moves on to the Select-IR-Scan state.

Select-IR-Scan: This is a temporary controller state in which all test data registers selected by the current instruction retain their previous state. If TMS is held low and a rising edge is applied to TCK when the controller is in this state, then the controller moves into the Capture-IR state and a scan sequence for the instruction register IR is initiated. If TMS is held high and a rising edge is applied to TCK, the controller returns to the Test-Logic-Reset state.

Capture-DR: In this controller state data may be parallel-loaded into test data registers selected by the current instruction on the rising edge of TCK. If a test data register selected by the current instruction does not have a parallel input, or if capturing is not required for the selected test, then the register retains its previous state unchanged. When the TAP controller is in this state and a rising edge is applied to TCK, the controller enters either the Exit1-DR state if TMS is held at 1 or the Shift-DR state if TMS is held at 0.

Shift-DR: In this controller state, the test data register connected between TDI and TDO as a result of the current instruction shifts data one stage towards its serial output on each rising edge of TCK. Test data registers that are selected by the current instruction, but are not placed in the serial path, retain their previous state unchanged. When the TAP controller is in this state and a rising edge is applied to TCK, the controller enters either the Exit1-DR state if TMS is held at 1 or remains in the Shift-DR state if TMS is held at 0.

Exit1-DR: This is a temporary controller state. If TMS is held high, a rising edge is applied to TCK while in this state causes the controller to enter the Update-DR state, which terminates the scanning process. If TMS is held low and a rising edge is applied to TCK, the controller enters the Pause-DR state.

Pause-DR: This controller state allows shifting of the test data register in the serial path between TDI and TDO to be temporarily halted. All test data registers selected by the current instruction retain their previous state unchanged. The controller remains in this state while TMS is low. When TMS goes high and a rising edge is applied to TCK, the controller moves on to the Exit2-DR state.

Exit2-DR: This is a temporary controller state. If TMS is held high and a rising edge is applied to TCK while in this state, the scanning process terminates and the TAP controller enters the Update DR controller state. If TMS is held low and a rising edge is applied to TCK, the controller enters the Shift-DR state. All test data registers selected by the current instruction retain their previous state unchanged.

Update-DR: Some test data registers may be provided with a latched parallel output to prevent changes at the parallel output while data is shifted in the associated shift-register path in response to certain instructions. Data is latched onto the parallel output of these test data registers from the shift-register path on the falling edge of TCK in the Update-DR controller state. The data held at the latched parallel output should not change other than in this controller state unless operation during the execution of a self-test is required (e.g., during the Run-Test/Idle controller state in response to design-specific public instruction). All shift-register stages in test data registers selected by the current instruction retain their previous state unchanged. When the TAP controller is in this state and a rising edge is applied to TCK, the controller enters either the Select-DR-Scan state if TMS is held at 1 or the Run-Test/Idle state if TMS is held at 0.

Capture-IR: In this controller state the shift-register contained in the instruction register IR loads a pattern of fixed logic values on the rising edge of TCK. In addition, design-specific data may be loaded into shift register stages that are not required to be set to fixed values. Test data registers selected by the current instruction retain their previous state. When the TAP controller is in this state and a rising edge is applied to TCK, the controller enters either the Exit1-IR state if TMS is held at 1 or the Shift-IR state if TMS is held at 0.

Shift-IR: In this controller state the shift-register contained in the instruction register IR is connected between TDI and TDO and shifts data one stage towards its serial output on each rising edge of TCK. Test data registers selected by the current instruction retain their previous state. When the TAP controller is in this state and a rising edge is applied to TCK, the controller enters either the Exit1-IR state if TMS is held at 1 or remains in the Shift-IR state if TMS is held at 0.

Exit1-IR: This is a temporary controller state. If TMS is held high, a rising edge applied to TCK while in this state causes the controller to enter the Update-IR state, which terminates the scanning process. If TMS is held low and a rising edge is applied to TCK, the controller enters the Pause-IR state. Test data registers selected by the current instruction retain their previous state.

Pause-IR: This controller state allows shifting of the instruction register IR to be halted temporarily. Test data registers selected by the current instruction retain their previous state. The controller remains in this state while TMS is low. When TMS goes high and a rising edge is applied to TCK, the controller moves on to the Exit2-IR state.

Exit2-IR: This is a temporary controller state. If TMS is held high and a rising edge is applied to TCK while in this state, termination of the scanning process results, and the TAP controller enters the Update-IR controller state. If TMS is held low and a rising edge is applied to TCK, the controller enters the Shift-IR state. Test data registers selected by the current instruction retain their previous state.

Update-IR: The instruction shifted into the instruction register IR is latched onto the parallel output from the shift-register path on the falling edge of TCK in this controller state. Once the new instruction has been latched, it becomes the current instruction. Test data registers selected by the current instruction retain their previous state. When the TAP controller is in this state and a rising edge is applied to TCK, the controller enters the Select-DR-Scan state if TMS is held at 1 or the Run-Test/Idle state if TMS is held at 0. The Pause-DR and Pause-IR controller states are included so that shifting of data through the test data or instruction register IR can be temporarily halted.

According to the present invention as shown in FIG. 2, the TAP architecture 15 and logic 15 described above is utilized to enable access to the embedded memories of a CPU-based IC via the MEMACC register 2. The MEMACC register 2 comprises (from the LSB to the MSB) an address field 4 (bit cells 0–23) for storing an address which specifies the memory location to be written to or read from, a data field 6 (bit cells 24–56) for temporarily storing data read from or to be written to the specified memory location, and a command field 8 (bit cell 57) for storing a command bit which instructs the MIU 5 whether to perform a read operation (a binary 1) or a write operation (a binary 0) to the specified memory location.

The bit cells making up the different fields of the MEMACC register 2 are designed to support the various serial and parallel modes for accessing the MEMACC register 2 required to establish it as an interface between the TAP architecture 15 and the MIU 5. For instance, each field of the MEMACC register 2 needs to support the serial shifting of data through the register 2 (in and out) as this is the manner in which the TAP architecture communicates with its associated registers. Additionally, each of the address, data and command fields 4,6,8 interface in parallel with the access circuitry 25 of the MIU 5, which preferably includes a memory address register (MAR), a memory data register (MDR) and a memory command register (MCR), in order to read and write the specified memory locations. Therefore, to transmit the addresses, data and commands to the MIU 5 access circuitry 25, the MEMACC fields 4,6,8 must also be able to support parallel writing of their bits to the respective memory registers. Similarly, since a read operation requires data to be written back in parallel from the memory data register MDR to the data field 4 of the MEMACC register 2, this field 4 must further support the parallel loading of data bits from the memory data register MDR.

Figure 3A:
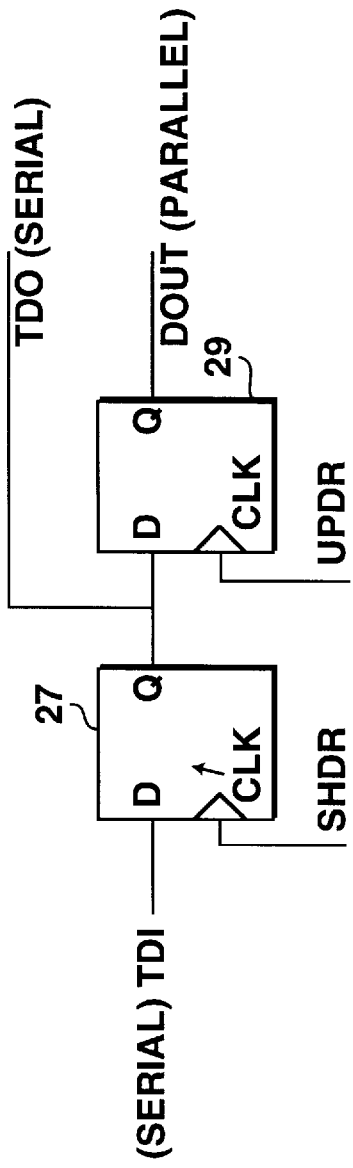
FIG. 3(a) is a schematic diagram of a bit cell for an update only type register utilized in the address and command fields of the MEMACC register.
Figure 3B:
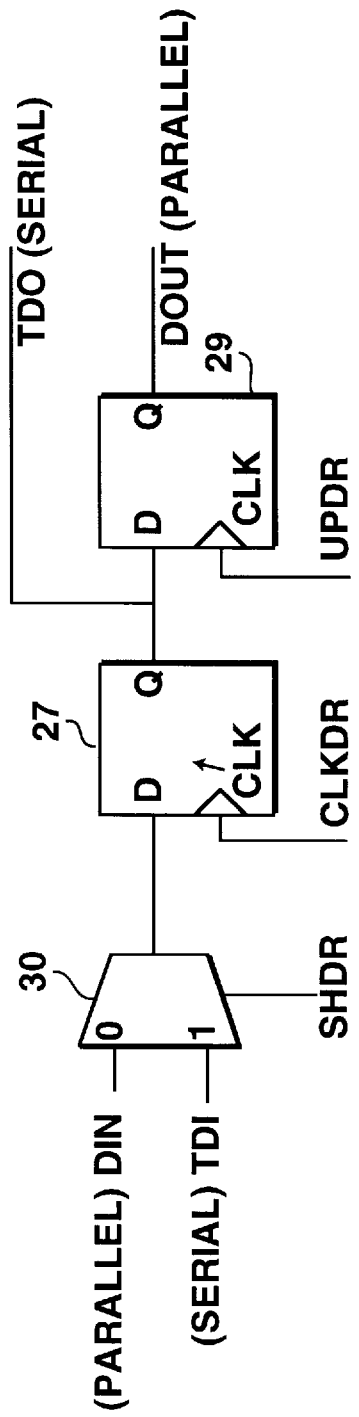
FIG. 3(b) is a schematic diagram of a bit cell for a capture and update type register utilized in the data field of the MEMACC register.

Hence, in implementation of the MEMACC register 2 as shown in FIG. 2, the address and command fields 4,8 comprise "update only" type bit cells (shown in FIG. 3(a)) coupled together to form "UPDATE ONLY" shift registers capable of serial shifting and parallel writing of their respective bits. The data field 6, on the other hand, comprises "capture and update" type bit cells (shown in FIG. 3(b)) coupled together to form a "CAPNUP" shift register capable of parallel loading, serial shifting and parallel writing of its data bits. As shown in FIGS. 3(a) and (3b), each of the "update only" and "capture and up date" type bit cells preferably comprise an edge triggered master/slave D-flip-flop 27 and a level sensitive latch 29 coupled together as shown for performing the above-described functions. For the CAPNUP type bit cells, a multiplexor 30 is added for selecting between the parallel data in (DIN) from the memory data register MDR and the serial data in (TDI) from the instruction register IR 45 or previous bit cell. To control the operation of the bit cells of each of these registers, control signals in the form of SHDR, CLKDR and UPDR are transmitted from the TAP controller 55 to each of the bit cells of the respective registers (as shown in FIG. 3) in response to corresponding control signals input from the external host 32 to the TAP controller 55 via the TMS pin.

In operation of the UPDATE ONLY shift registers forming the address and command fields 4,8 of the MEMACC register 2, the bits at the TDI input are shifted into the corresponding flip-flops 27 by applying the SHDR command signal from the TAP controller while the old bits stored in the flip-flops 27 are simultaneously shifted out through TDO. In order to write the bits stored in the flip-flops 27 of these registers to the MIU access circuitry 25, the UPDR command signal is applied to load the bits from the flip-flops 27 to the level sensitive latches 29 where they are subsequently written in parallel to the memory registers. In operation of the CAPNUP shift register forming the data field 6 of the MEMACC register 2, the serial shifting and writing of bits is performed by the procedure described above. However, upon applying the CLKDR command signal to the register 2, the bits of the memory data register MDR are written into the corresponding flip flops 27 of the data field 6.

Utilizing the TAP controller 55 states set forth above, read and write operations to embedded memories of an IC via the MEMACC register 2 can be performed by sequentially applying binary 1 and 0 signal states to the TMS pin during each clock of the TCK pin to navigate the finite state machine of the TAP controller 55 through those states. To select the MEMACC register 2 as the current, operational register, a MEMACC opcode of 1101 is shifted into the instruction register IR 45 by traversing the TAP controller 55 states of Test-Logic Reset, Run-Test/Idle, Select-DR-Scan, Select-IR-Scan, Capture-IR and Shift-IR. Upon entering the SHIFT-IR state, a logical 0 signal is applied to the TMS pin for four clock cycles so that the opcode bits 1101 will be serially shifted in through the TDI pin. Next, the TAP controller 55 requests the memory bus (both MemAdd and MemData) for the MEMACC register 2 (via a bus request to the bus controller of the MIU) by traversing the states of Shift-IR, Exit1-IR, Pause-IR, Exit2-IR, Update-IR and Run-Test/Idle. The bus request actually occurs when the TAP controller 55 reaches the state of Update-IR where the opcode bits within the instruction register IR 45 are transmitted in parallel to the TAP controller 55 which executes the opcode instruction and issues a bus request to the MIU 5 bus controller.

In order to perform a read operation, the TAP controller 55 must be instructed to traverse the states of Select-DR-Scan, Capture-DR and Shift-DR. When the Shift-DR state is reached, a logical 0 signal is applied to the TMS pin for 57 clock cycles so that an address such as FFFF00 followed by a 32 bit data string (ignored for read operations) followed by a command bit value of 1 (to initiate a read) is received by the MEMACC register 2 from the external host 32 via the TDI pin. The read operation will not be requested until the TAP controller 55 enters the UPDATE-DR state where the bits within the MEMACC register 2 are loaded in parallel into the associated level-sensitive latches 29 coupled to the flip-flops 27 of the register 2 and subsequently transmitted to the corresponding memory registers of the MIU 5. Several clock cycles after the request, the MIU 5 will return the data bits stored in the specified memory location and load them into the data field 6 of the MEMACC register 2.

The returned data bits in addition to the address and command bits of the register 2 are then shifted out by first entering CAPTURE-DR where all the bits within the associated latches 29 are input in parallel to the MEMACC register 2. The TAP controller 55 is next moved to the SHIFT-DR state and held there for 57 clock cycles by the application of a logical 0 signal state to the TMS pin during each cycle. In this manner, the entire contents of the MEMACC register 2 is serially output through the TDO pins to a buffer within the external host 32 where bits 24 through 56 of the transmitted data represent the data at address location FFFF00.

In order to perform a write operation the above steps are modified as follows. To write FFEEDDCC to address 00FF00 the following is done: If the MEMACC opcode is not then in effect, the TAP controller 55 will have to be navigated to the SHIFT-IR state and held there for four cycles to shift in the opcode for the MEMACC instruction. Next, the TAP controller 55 is instructed to request the memory bus by navigating it to the Run-Test/Idle state in the same manner as was done for the read operation. Then the TAP controller 55 is instructed to request a write operation. This is done by taking the TAP controller 55 to the SHDR state, shifting address 00 FF00followed by the data FFEEDDCC, followed by the write command bit "0". Finally, the MIU 22 will perform the write operation when the state UPDATE-DR is visited.

In this manner, pseudo-direct accesses to embedded memories of a CPU-based IC can be accomplished. Testing of the memory locations (in addition to the associated decoders and sense amps) can then be done by comparing the data read from a specific memory location with the data previously written to that location. This is performed by the external host, 32 which preferably comprises an ATE system (although a processor-based system would work just as well). According to a preferred method for testing the embedded memories of the IC, the external host 32 simulates preselected operations of the CPU-based IC using a software behavioral model of the IC. During simulation, the host 32 stores the data input to and output from the model in an event history file. The input data of the event history file is then used to execute the same operations in the IC, while the host 32 monitors the data output from the IC and compares it with the output data previously stored in the event history file. The memory locations of the embedded memories 20 which do not contain the expected data are then tagged by the host 32 for subsequent use by a debugger.

Alternatively, the external host 32 can be programmed to write a first string of bits (address, data and write command) stored in a first buffer of the host 32 to the MEMACC register 2, while the data bits of the register 2 are subsequently written to the specified memory location. The host 32 then writes a second string of bits (address, data and read command) stored in a second buffer of the host 32 to the MEMACC register 2, while the data bits of the same specified memory location are read and written back into the MEMACC register 2. Once the modified second string of bits is output to the external host, the host 32 can then compare the data bits in that string (i.e., bits 24–56) with the corresponding data bits of the first string stored in the first buffer. Optionally, the host 32 can simply compare the two consecutive bit strings as they are sequentially output from the TAP port 50 without use of the first and second buffers. If the data bits in the data field of the compared bit strings do not match, then these data bits can be tagged and associated with the specific memory locations from which they came for use by a debugger in determining the defective memory locations of the IC.

The present invention therefore provides a pseudo-direct access to embedded memory arrays of an IC without the need to utilize the normal channels or the logic of the on-board CPU which has a high probability for failure and may fail upon the occurrence of a defect. Additionally, this is accomplished with a minimum of internal interconnections and logic so as to inhibit failure of the method and apparatus of the present invention when a manufacturing defect occurs within the IC. Advantageously, a significant amount of time as well as manufacturing resources can be saved in identifying manufacturing defects that need to be corrected for process improvement since process developers no longer need to run a plurality of test batches or decipher the logical states of a failed CPU.

While the invention has been described in conjunction with the preferred embodiment, it is evident that numerous alternatives, depictions, variations and uses will be apparent to those skilled in the art in light of the foregoing description. Thus, it is understood that the invention is not to be limited by the foregoing illustrative details, but rather is to be defined by the appended claims.

We claim:

1. A method for performing read and write operations to an embedded memory of an integrated circuit, the method comprising the steps of:

transmitting a memory access instruction from an external host to a register of an input/output (I/O) means within the integrated circuit, the I/O means further comprising an output connection coupled to the external host, and an I/O controller;

the I/O controller acquiring control over a memory bus within the integrated circuit in response to execution of the memory access instruction;

transmitting a signal from the external host via the I/O means to a memory shift register within the integrated circuit, the memory shift register coupled to an access circuitry of a memory interface unit within the intergrated circuit enabling access to memory locations of the embedded memory without use of the central processing unit of the integrated circuit, the signal comprising an address specifying a memory location within the embedded memory, data and an instruction specifying a write operation or a read operation; and performing the operation specified by the instruction on the embedded memory.

2. The method of claim 1 wherein:

the step of the I/O controller acquiring control includes the steps of transmitting the memory access instruction from the register to the I/O controller where the memory access instruction is executed by the I/O controller, and the I/O controller requesting the memory bus in response to execution of the memory access instruction; and the step of performing the specified operation includes the steps of if the instruction received by the memory shift register specifies a write operation, then performing a write to the embedded memory, the write operation being performed by transmitting the address, the data and the instruction from the memory shift register to the access circuitry of the memory interface unit, and transmitting the data from the memory interface unit to the memory location specified by the address, and if the instruction received by the memory shift register specifies a read operation, then performing a read from the embedded memory, the read operation being performed by transmitting the address and the instruction within the memory shift register to the access circuitry of the memory interface unit, replacing the data within the memory shift register with the data stored in the memory location specified by the address, and transmitting the address, the data and the instruction currently within the memory shift register to the external host via the output connection.

3. An apparatus for performing read and write operations to an embedded memory of an integrated circuit, the integrated circuit including a CPU one or more internal registers, and a memory interface unit with an access circuitry which provides access to the embedded memory via the memory interface unit without use of the CPU, the internal registers coupled to the memory interface unit for reading and writing memory locations of the embedded memory, the apparatus comprising:

an input/output (I/O) means coupled between an external host and the integrated circuit for transmission of signals between the external host and a selected internal register of the integrated circuit, the I/O means comprising a register coupled between the external host and the selected internal register for transmitting said signals comprising addresses, data and instructions from the external host to the selected internal register, an I/O controller coupled to the external host and the selected internal register for transmitting signals comprising controls from the external host to the selected internal register, the I/O controller further coupled to the register for receiving signals comprising instructions transmitted from the external host to the register, and an output connection coupled between the selected internal register and the external host for transmitting signals comprising addresses, data and instructions from the selected internal register to the external host.

4. The apparatus of claim 3 wherein at least one of the one or more internal registers is a memory shift register, the memory shift register coupled between the register and the output connection upon being selected as the selected internal register, the memory shift register coupled to the access circuitry of the memory interface unit for reading and writing memory locations of the embedded memory in response to the addresses, data, instructions and controls received from the register and the I/O controller of the I/O means.

5. The apparatus of claim 4, wherein the memory shift register comprises a series of bit cells forming an address field, a data field and an instruction field for temporarily storing the addresses, data and instructions received from the register, respectively, the bit cells of the address and instruction fields each comprising a flip-flop having an input coupled to one of the register and a TDO output of a preceding bit cell in the series of bit cells, each flip-flop further having a TDO output coupled to both a level sensitive latch and one of a subsequent bit cell in the series of bit cells and the output connection, the level sensitive latch having a DOUT output coupled to the access circuitry of the memory interface unit, the flip-flop and the level sensitive latch of each bit cell of the address and instruction fields coupled to the I/O controller for receiving signals comprising controls for controlling operation of the flip-flop and the level sensitive latch.

6. The apparatus of claim 5, wherein the bit cells of the data field of the memory shift register each comprise a multiplexor having a first input coupled to one of the register and the TDO output of a preceding bit cell in the series of bit cells and a second DIN input coupled to the access circuitry of the memory interface unit, each bit cell of the data field further comprising a flip-flop having as input one of the first and second inputs to the multiplexor and having a TDO output coupled to both a level sensitive latch and one of a subsequent bit cell in the series of bit cells and the output connection, the level sensitive latch having a DOUT output coupled to the access circuitry of the memory interface unit, the multiplexor, flip-flop and the level sensitive latch of each bit cell of the data field coupled to the I/O controller for receiving signals comprising controls for controlling operation of the multiplexor, the flip-flop and the level sensitive latch.

7. The apparatus of claim 3 wherein the I/O controller includes a finite state machine for controlling operation of the register and the selected internal register in response to the controls and instructions received from the external host.

8. A method for testing an embedded memory of an integrated circuit, the method comprising the steps of:

instructing the integrated circuit to execute a preselected operation using a first set of data;

storing in the embedded memory a second set of data produced by execution of the preselected operation in the integrated circuit; and reading the second set of data from the embedded memory by means of transmitting a memory access instruction from an external host to a register of an input/output (I/O) means within the integrated circuit, the I/O means further comprising an output connection coupled to the external host, and an I/O controller;

the I/O controller acquiring control over a memory bus within the integrated circuit in response to execution of the memory access instruction;

transmitting signals from the external host via the register to a memory shift register within the integrated circuit, the memory shift register coupled to an access circuitry of a memory interface unit within the intergrated circuit for enabling access to the embedded memory without use of the central processing unit of the integrated circuit, the signals comprising at least an address specifying a memory location within the embedded memory and an instruction specifying a read operation from the specified memory location, and transmitting the address, and the data stored in the specified memory location to the external host via the output connection; and comparing the second set of data with a predetermined result.

9. The method of claim 8 further comprising the step of producing the predetermined result, prior to the step of comparing, by emulating the preselected operation of the integrated circuit with a behavioral model of the integrated circuit, the predetermined result representing data produced by executing the preselected operation in the behavioral model using the first set of data.

10. A method of accessing an embedded memory of an integrated circuit, the method comprising the steps of:

an external host transmitting a memory access instruction to a test access port within the integrated circuit, the test access port coupled to the external host and including an input/output (I/O) controller;

the I/O controller acquiring control over a memory bus within the integrated circuit in response to execution of the memory access instruction;

the external host transmitting data via the test access port to a memory access register within the integrated circuit, the memory access register coupled to a memory access circuitry within the the intergrated circuit enabling access to memory locations of the embedded memory without use of the central processing unit of the integrated circuit, the data comprising an address specifying a memory location within the embedded memory, and an access operation; and the memory access circuitry accessing the memory location specified by performing the access operation.

11. An apparatus for accessing an embedded memory of an integrated circuit, the apparatus comprising:

a test access port coupled between an external host and a memory interface unit (MIU) of the integrated circuit, the test access port transmitting signals between the external host and the MIU, the test access port including an instruction register configured to transmit a signal from the external host to the MIU, the signal comprising an address, data and a command, an input/output (I/O) controller coupled to the external host and the MIU, the I/O controller providing control signals to the MIU from the external host, and an output connection coupled between the external host and the MIU, the output connection outputting data retrieved from the embedded memory through the MIU to the external host; and a register internal to the MIU, the register coupled to an access circuitry of the MIU, the access circuitry providing access to the embedded memory responsive to the command.

* * * * *